United States Patent
Patten et al.

(10) Patent No.: US 6,832,552 B2
(45) Date of Patent: Dec. 21, 2004

(54) METHOD OF AUTOMATED SETTING OF IMAGING AND PROCESSING PARAMETERS

(75) Inventors: Scott Andrew Patten, Vancouver (CA); Thomas W. Steiner, Burnaby (CA); Michel Laberge, Bowen Island (CA)

(73) Assignee: Creo Inc., Burnaby (CA)

( * ) Notice: Subject to any disclaimer, the term of this patent is extended or adjusted under 35 U.S.C. 154(b) by 517 days.

(21) Appl. No.: 09/888,595

(22) Filed: Jun. 26, 2001

(65) Prior Publication Data

US 2002/0196473 A1 Dec. 26, 2002

(51) Int. Cl.$^7$ ............................................. B41N 3/00
(52) U.S. Cl. ................... 101/463.1; 101/484; 382/112; 702/85
(58) Field of Search .............................. 101/463.1, 464, 101/465, 466, 467, 484; 382/112; 702/108, 85

(56) References Cited

U.S. PATENT DOCUMENTS

| | | | | |
|---|---|---|---|---|
| 4,002,829 A | * | 1/1977 | Hutchison | 358/481 |
| 4,003,660 A | | 1/1977 | Christie, Jr. et al. | |
| 4,393,411 A | * | 7/1983 | Amtower | 358/302 |
| 4,553,033 A | * | 11/1985 | Hubble et al. | 250/353 |
| 4,649,502 A | | 3/1987 | Keller et al. | |
| 4,665,496 A | | 5/1987 | Ott | |
| 4,677,680 A | | 6/1987 | Harima et al. | |
| 4,718,340 A | * | 1/1988 | Love, III | 101/116 |
| 5,058,500 A | * | 10/1991 | Mizuno | 101/142 |
| 5,182,721 A | | 1/1993 | Kipphan et al. | |
| 5,202,934 A | | 4/1993 | Miyakawa et al. | |
| 5,440,398 A | * | 8/1995 | Holowko et al. | 358/3.29 |
| 5,471,324 A | | 11/1995 | Rolleston | |
| 5,530,656 A | | 6/1996 | Six | |
| 5,663,898 A | | 9/1997 | Claes et al. | |
| 5,713,287 A | * | 2/1998 | Gelbart | 101/467 |
| 5,737,090 A | * | 4/1998 | Christopher et al. | 358/3.29 |
| 5,790,275 A | * | 8/1998 | Iizuka | 358/474 |
| 5,816,164 A | * | 10/1998 | Loffler | 101/484 |
| 5,924,364 A | * | 7/1999 | Grabley et al. | 101/457 |
| 6,031,932 A | | 2/2000 | Bronstein et al. | |
| 6,137,580 A | | 10/2000 | Gelbart | |

FOREIGN PATENT DOCUMENTS

| | | |
|---|---|---|
| JP | 58-216907 A2 | 12/1983 |
| JP | 63-052005 A2 | 3/1988 |

* cited by examiner

Primary Examiner—Daniel J. Colilla
Assistant Examiner—Jill E. Culler
(74) Attorney, Agent, or Firm—Oyen Wiggs Green & Mutala

(57) ABSTRACT

Methods and apparatus for determining the optimal adjustment of imaging systems used to prepare lithographic printing surfaces for a printing press are described. A series of test patterns are imaged while varying a particular imaging parameter. This is followed, if necessary, by processing the plate in processing line. The plate is then returned to the digital imaging system where the reflectivity of the imaged test patterns is measured using a radiation source and detector, to determine the optimal setting for the parameter.

37 Claims, 7 Drawing Sheets

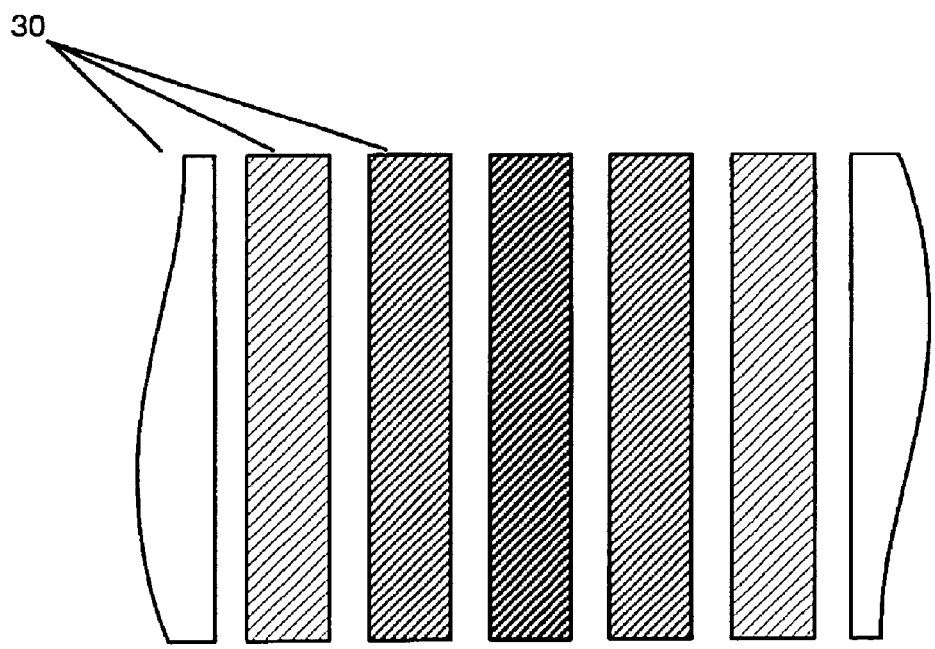
FIG. 5-A
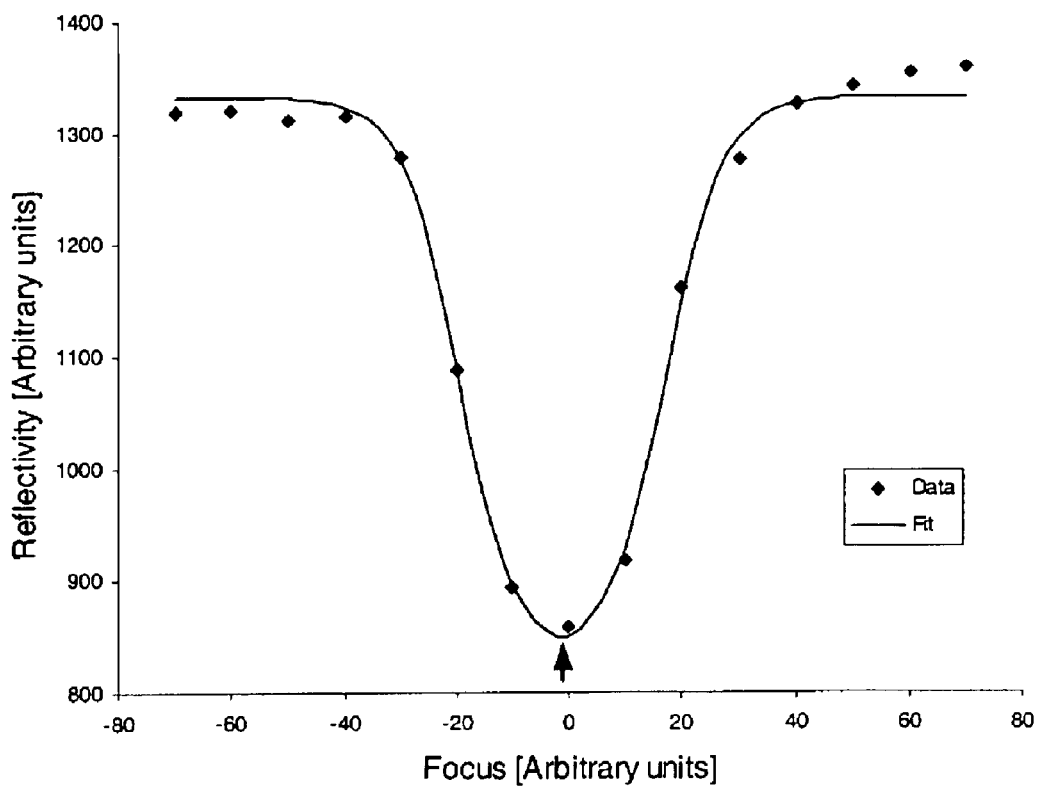
FIG. 5-B

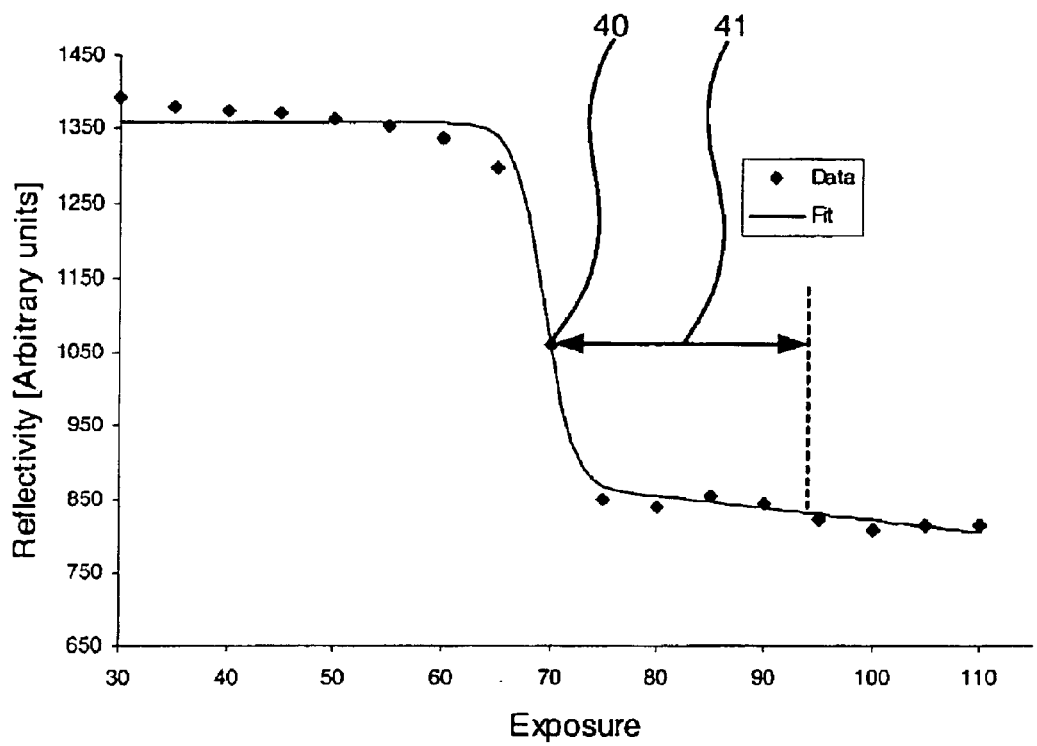
FIG. 5-C
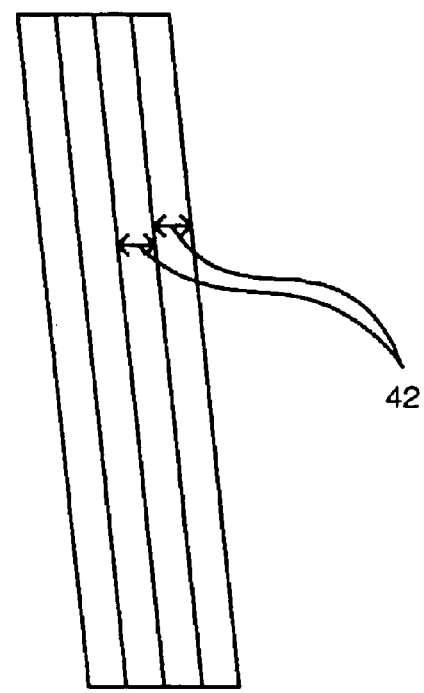
FIG. 5-D

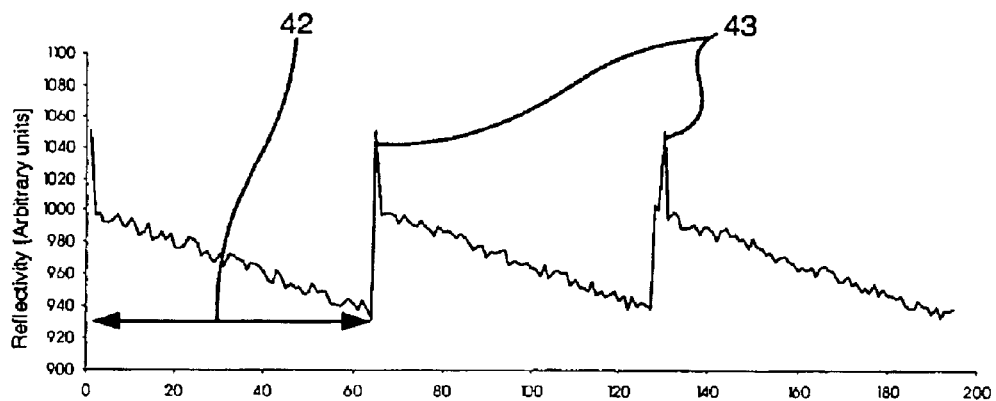
FIG. 5-E
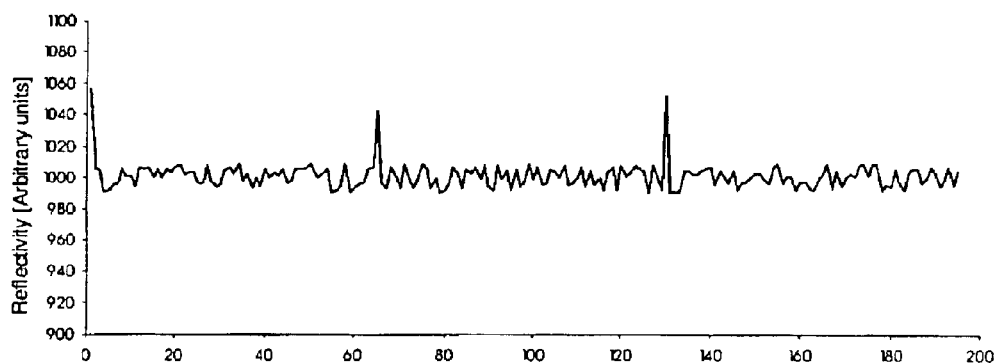
FIG. 5-F
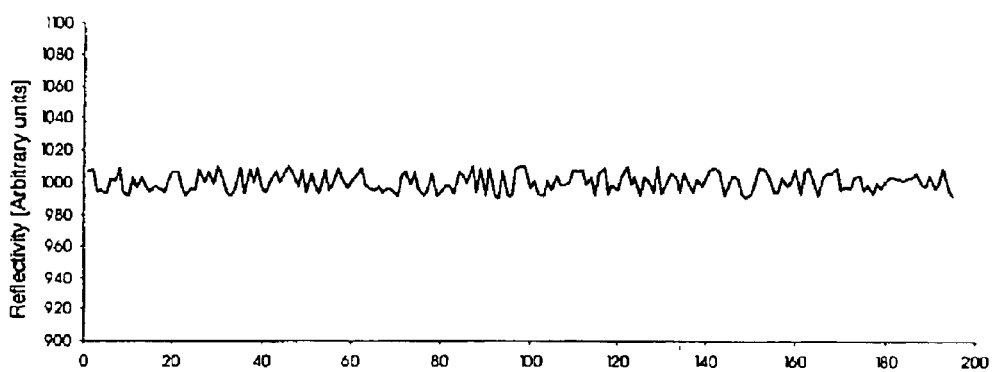
FIG. 5-G

METHOD OF AUTOMATED SETTING OF IMAGING AND PROCESSING PARAMETERS

BACKGROUND OF THE INVENTION

The invention disclosed herein relates generally to the field of printing systems and, more particularly to a system capable of imaging specialized lithographic plates for use in printing operations and, more particularly to methods of automatically adjusting such systems for optimum performance.

Commonly a printing operation, undertaken on a printing press, utilizes a lithographic plate which is produced in a separate process involving an exposure of an image onto the plate which is typically a thin aluminium alloy or polyester base suitably treated so as to be sensitive to light or heat radiation.

The method of making a lithographic plate suitable for use on a printing press has commonly been to produce a film mask using a low power laser printer known as an "imagesetter" exposing a highly sensitive film media. The film media is usually processed in some manner and then placed in area contact with a photosensitive plate and a flood or area exposure is made through the film mask. The most common lithographic plates used in such a process are sensitive to radiation in the ultraviolet region of the spectrum. The plate is then processed through a chemical solution to develop the image.

More recently, a method of exposing a lithographic printing plate directly through use of a specialized printer known as a platesetter is gaining popularity. A platesetter in combination with a computer system that receives and conditions the image data for sending to the platesetter is commonly known as a Computer-to-Plate or CTP system. CTP systems offer a substantial advantage over imagesetters in that they eliminate the film and the associated process variation associated with that extra step.

The CTP system receives the image data and formats it to make it suitable for outputting to an exposure head which in turn controls a radiation source, which could be a laser, so as to image picture elements (pixels) on the plate. The radiation beams induce a physical or chemical change to the coating on the lithographic plate. It is usually necessary to amplify the difference between the exposed and un-exposed areas in a further chemical processing step that removes the unwanted coating and converts the plate into a lithographic printing surface ready for use on the press. The processing step may include pre-baking the plate in an oven, washing in chemical solutions and possibly a post-processing bake cycle.

In contrast, some lithographic plates now available, do not require a further processing step and the imaging is either fully completed by the platesetter or will be completed once mounted on the press. The typical methods of on-press developing include allowing the non-image areas simply to wear off during the print job make-ready or dissolving these regions in a fountain solution, which is already a standard component in offset printing, or a combination of both methods. Such plates are referred to as "processless" since they eliminate the need for a separate processing step although in practice the processing is accomplished by simply running the press. While this step may require quite a number of impressions to sufficiently process the plate, it can be done substantially in parallel with the normal set up of a printing job on the press.

Other processless plates work in an ablative fashion where the unwanted areas are removed by the imaging process. In this case, the imaging and processing are achieved simultaneously although it is usually necessary to provide a debris collection system to draw the ablated products away from the plate surface.

It is quite common for manufacturers of printing presses to include quality monitoring systems on their presses which function to monitor some aspect of the printing process. In some cases, the monitoring system will provide feedback to the press operator or even a closed-loop feedback to a process controller that then effects a correction to the process. There are numerous disclosures of systems that use photosensors, Charge Coupled Device (CCD) cameras or other means to monitor a variety of features of the printed article. Systems capable of controlling the ink feed to the press, controlling print quality and looking for defects in the printed product have all been previously disclosed. Typically such systems reside on the press and either compare the readings of the print density of the printed product to a previously stored reference or they print supplemental test targets of a pre-determined pattern which can then be viewed by the sensor and analysed in order to determine the necessary process corrections.

All of these systems used to monitor the printing process have a common theme of improving the process control of the printing operation. They are either concerned with ensuring that subsequent impressions of an image are of consistent quality or they teach methods of closed loop process control which try to maintain the print quality at some pre-determined target level.

In contrast, the art is not as well advanced in the area of ensuring that the actual plate made in the CTP system or by other means is optimally imaged and processed. For most CTP lithographic plates, particularly those intended for long run printing, the imaging and processing of the plate is critical to ensure that the image areas do not wear off the plate prematurely. Since the CTP system writes the plate directly, it becomes feasible to add monitoring and process control, which can be applied towards controlling the quality of plates. While not impossible to add similar controls to an imagesetter the extra imaging step makes it impractical since it may not be possible to determine whether a particular feature is caused by the imagesetter, the film processing, the contact exposure, or the plate processing. With two of these aforementioned steps removed, the viability of providing good platemaking process control is significantly improved.

In platemaking there are a number of imaging process parameters that need to be optimally set for best results. One of the most critical parameters is the level of exposure given to the plate in the imaging step. Exposure is defined as the amount of radiant energy per unit area that impinges on the plate during the imaging process. Depending on the plate type being imaged it may be necessary to control this parameter within a few percent.

The situation is also further complicated in multi-beam platesetters in that each beam needs to impart a substantially equal exposure to the plate so that imaging errors or artefacts are not created. Unless it can be guaranteed that all beams of a multi-beam exposure head have identical size and propagation characteristics, it is not possible to do a simple power or intensity balance because exposure has both a spatial component and a power or intensity component. While it is possible to directly measure beam size the measurement is quite complicated and accurate results are difficult to achieve. Systems exist which are well suited to beam analysis but they are usually in the form of stand alone equipment and not at all suitable or cost-effective for inclusion in a CTP system.

The pragmatic approach, which is commonly adopted, is to let the plate be the measurement tool. Since the human eye is extremely sensitive to slight variations in a regular pattern a trained operator can make quite an effective diagnosis of an imaged and processed plate and perform the required adjustments to the platesetter based on their observations. Platemakers also make use of a densitometer, which is an instrument that determines the optical density of a substance by measuring the intensity of the light it reflects or transmits. Densitometers are useful for quantifying the ratio of image to non-image area and can assist in determining the correct exposure.

Whether using a densitometer or simply judging plates by eye the process remains manual and requires intervention of trained personnel. As the use of CTP systems grow in popularity, techniques that can be employed to conveniently set up the platesetter and processor combination for optimum performance become increasingly important. Additionally the possibility to exploit the computerization and integration of the CTP platemaking system to enhance process control is clearly a feature that would have significant impact on the usefulness of these systems to the printer.

SUMMARY OF THE INVENTION

A method and apparatus are provided for determining the optimal adjustment of an imaging system used to make lithographic plates for a printing press. A series of test patterns are imaged on a lithographic printing plate, while varying a particular imaging parameter. For plate types that require further processing to convert the imaged plate into a surface ready for use on a printing press, the imaging is followed by a processing step. Finally, the plate is read-back on the imaging system where the reflectivity of the imaged test patterns is measured to determine the optimal setting for the imaging parameter.

BRIEF DESCRIPTION OF THE DRAWINGS

FIG. 5-A shows a typical test pattern series that can be used.

FIG. 5-B is a graph of results recorded in an experiment to set the focus of an imaging system according to the disclosed method.

FIG. 5-C is a graph of results recorded in an experiment to set the exposure of an imaging system according to the disclosed method.

FIG. 5-D shows the imaging swaths of a multi-beam exposure head.

FIG. 5-E to 5-G show how the individual beam exposure is balanced in a multi-beam exposure head.

DESCRIPTION OF THE PREFERRED EMBODIMENT

Figure 1:
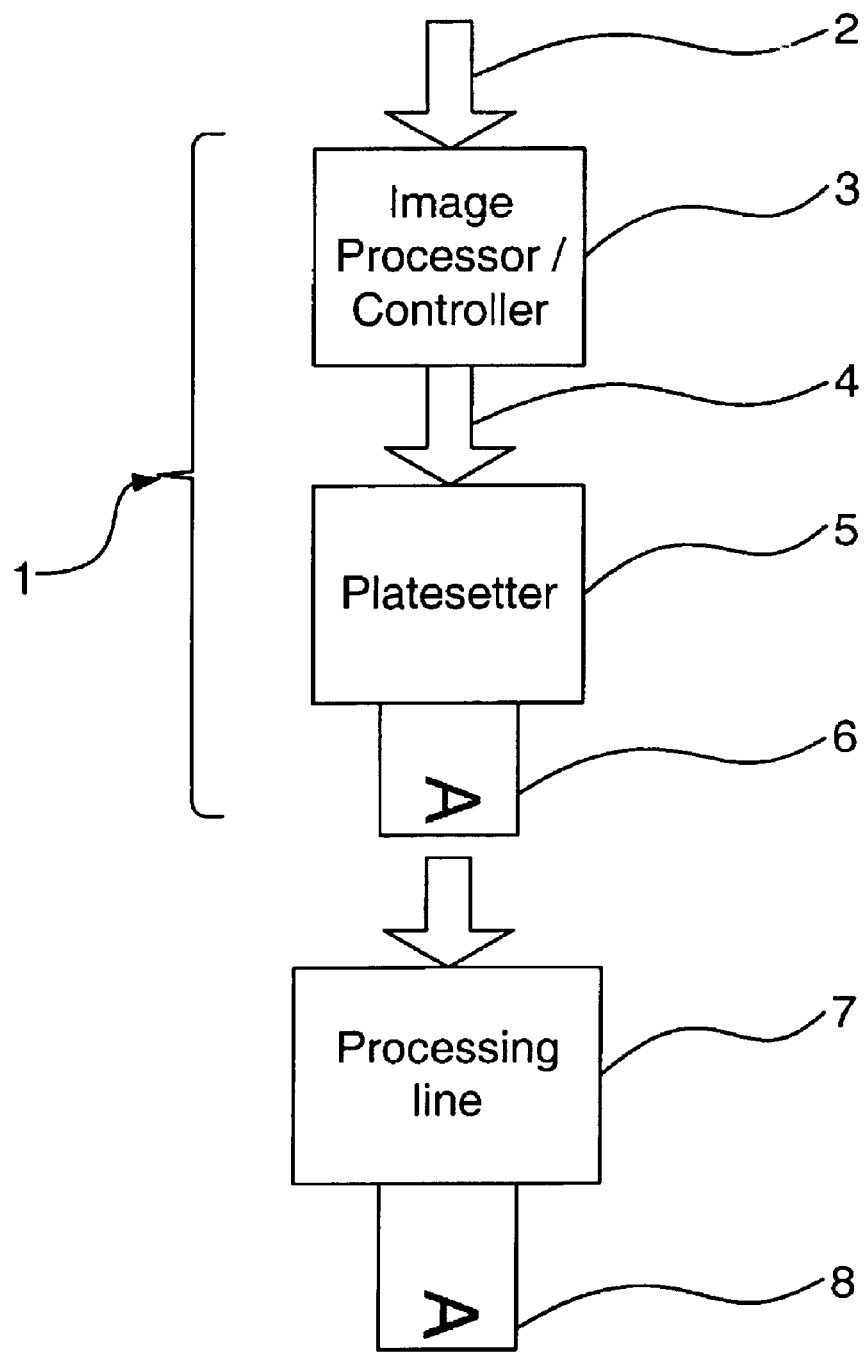
FIG. 1 is a schematic depiction of a typical CTP system and processing line.

Referring to FIG. 1 a typical CTP system 1 is shown. An image file 2, in one of many possible formats, is passed to a computer system 3 that converts image file 2 into image data 4 in a format readable by the platesetter 5. The platesetter 5 receives image data along with control signals that communicate how the plate is to be imaged.

On completion of imaging, the plate 6 is ejected by the platesetter and conveyed to a processing line 7, which delivers the processed lithographic plate 8 ready for use on a printing press.

The term lithographic printing precursor is used herein to describe any printing plate, printing cylinder or printing cylinder sleeve, or any other surface bearing a coating of imageable material that may be either converted or removed imagewise to create a surface that may be inked selectively and used for lithographic printing. The phrase lithographic printing surface is used herein to describe the selectively inkable surface so created. As a matter of convenience in this application, the term "plate" or "lithographic plate" is used to denote either the lithographic printing precursor or the lithographic printing surface where the distinction is unnecessary or is clear in the context.

Figure 2:
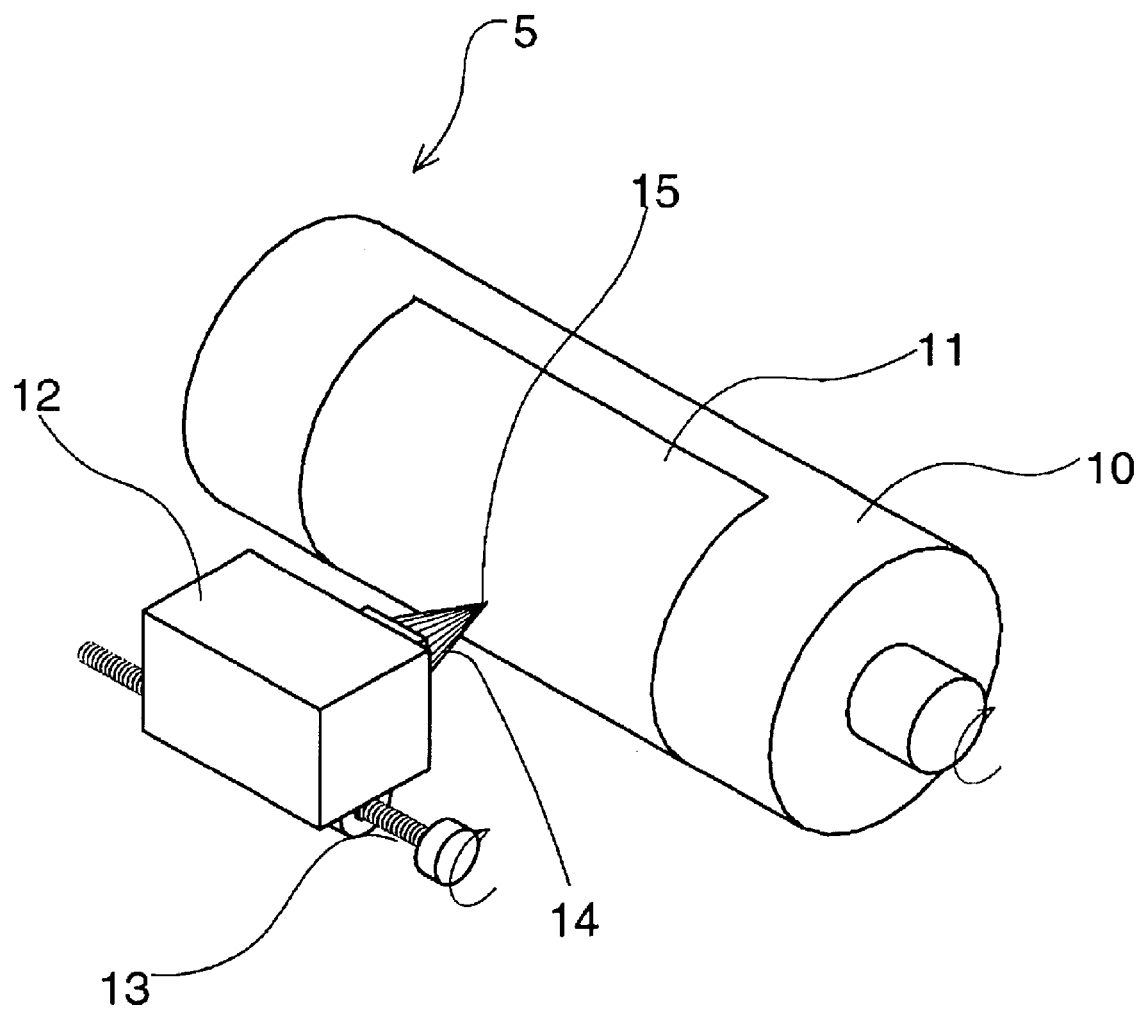
FIG. 2 depicts a typical external drum platesetter.

A platesetter system 5 is shown in FIG. 2. The main components of the system are a drum 10 that carries a lithographic plate 11. The drum 10 will typically have some means of clamping the plate to the drum surface (not shown). Drum 10 is also provided with a means of rotating about a central axis. Exposure head 12 contains a radiation source that is used to form an image on the plate 11.

Typically, an exposure head has a main exposing beam of radiation or multiple beams of radiation 14 which can be switched on and off in accordance with the image data to form individual radiation pixels at the plate surface 15. The main exposing beam is often referred to as the "write beam". Most exposure heads will make use of one or more laser devices, but any radiation source that can be controlled to produce radiation in response to imagewise data, could be used. The wavelength of radiation is selected to suit the plate type being exposed. Platesetter systems that use write radiation sources with wavelengths in the infrared, visible and ultraviolet spectrums are known in the art.

The exposure head 12 is coupled to a transport mechanism 13 that is operative to displace the exposure head in synchronism with the rotation of drum 10.

It is common for modern platesetter exposure heads to have a very narrow depth of focus that makes it necessary to be able to either adjust focus periodically or on-the-fly. In such systems, any significant drift will take the write radiation source out of focus. This can adversely affect the imaged plate. The effect can be quite pronounced and it is not uncommon for a drift of in the order of tens of $\mu$m to significantly degrade imaging performance. For this reason many systems are equipped with a focus adjustment mechanism, some effecting a simple adjustment of focus between plots, while others include a servo focus controller which continuously adjusts to keep the focus in exact adjustment.

The post-imaging processing step also has a number of variables that need to be optimally set to achieve the best printing results. Typically, the processing is strongly affected by the speed of transport through the chemical baths, the state of the chemistry in the processor and often the temperature of the chemistry as well. Furthermore if the processing line includes a pre-heat or post-bake oven its speed and temperature settings can also have a profound effect on the processed plate.

As can easily be appreciated there are two possibilities for creating a printing image on a lithographic plate. In the first case the write radiation source imparts a change to the areas that it hits and, in further processing steps, the areas not hit by the write radiation source are removed. This is known in the art as a negative working plate. Alternatively, in a positive working plate the write radiation source imparts a change to the plate coating that makes it more susceptible to being removed in a processing step. In this case, the image data needs to be bit-wise inverted in the imaging step to achieve the desired image in the processed plate. For convenience in this disclosure, we will refer only to the "negative" working case since all methods disclosed are equally effective regardless of whether a positive or negative working plate is used.

Most lithographic plates suitable for use in a CTP system undergo some change during the imaging cycle in the platesetter. The processing line typically hardens or applies further discrimination between image and non-image areas. Plates are typically only sensitive in some range of wavelengths and it is mostly valid that the plate will have a strong absorption of radiation in this wavelength range. In the lithographic printing process, the imaging and processing will typically combine to remove the coating down to the aluminium or polyester substrate in the non-image areas of the plate. Advantageously this surface commonly has quite different reflective properties than the imaged portions. The aim of this invention is to exploit these reflectivity differences to determine parameters relating to the quality of the exposed and processed plate.

Figure 3:
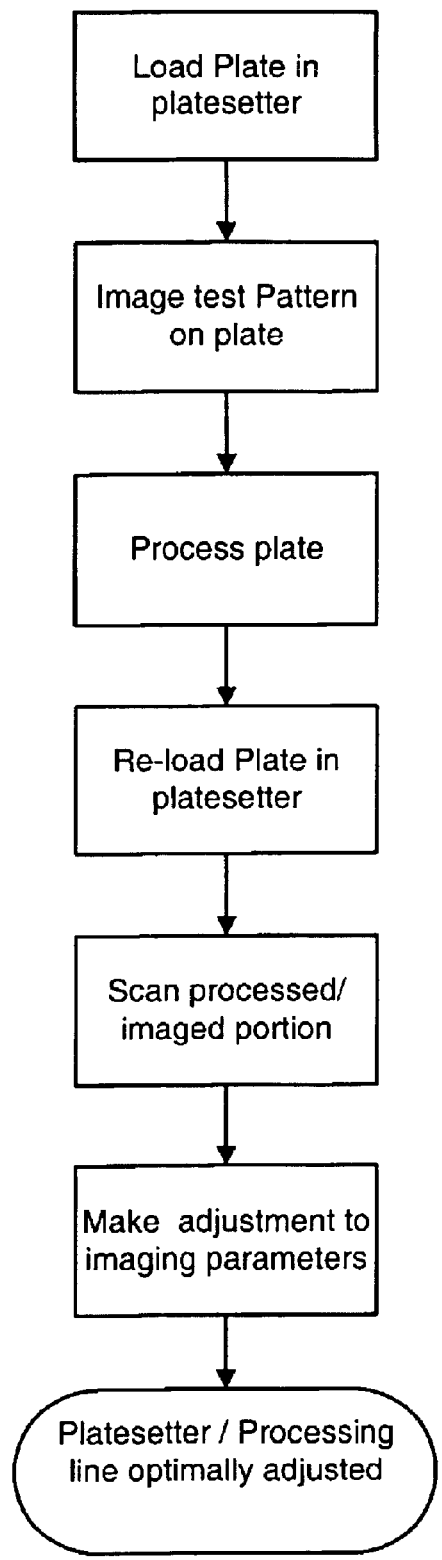
FIG. 3 is a flow diagram for the method detailed in this application.

FIG. 3 depicts a flow diagram of the method of the invention disclosed herein. A plate is loaded into a platesetter and a test pattern imaged. The test pattern may comprise a number of areas that are related to different parameters to be optimally set and may be a series of lines, a solid image, or some other selected pattern. There may be more than one test pattern per parameter. On completion of imaging, the plate is put through a processing line set up for the particular plate in use. The processed plate is then re-loaded into the platesetter and the test patterns read back using a means that will be described in more detail below. Adjustments are then made to the imaging parameters based on the read-back test patterns. Optionally the cycle can be repeated for verification.

Figure 4:
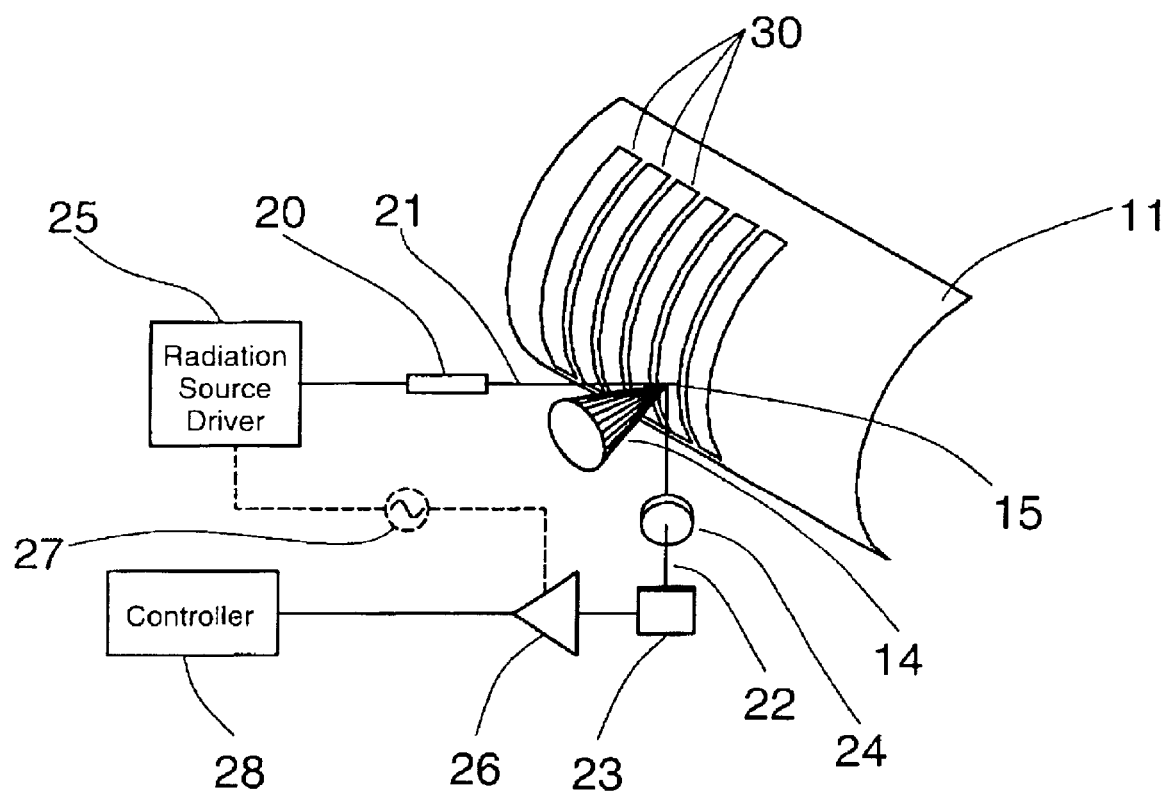
FIG. 4 is a schematic layout of a particular embodiment of the invention.

Referring now to FIG. 4, in a preferred embodiment of this invention an auxiliary radiation source 20 is disposed such as to direct its radiation beam 21 onto the surface of plate 11 at a point 15. A beam 22 is reflected back from plate 11. The intensity level of the reflected beam 22 depends on the reflectivity of the plate. A radiation detector 23 is positioned to pick up the reflected radiation after optionally being collected, focussed, and redirected by an optical element 24.

In the preferred embodiment of the present invention, auxiliary radiation source 20 is a laser and preferably a laser diode, which is compact and easy to power. Alternatively other radiation sources may be used, most notably a light emitting diode or LED. The auxiliary radiation source is powered and controlled by radiation source driver 25.

In selecting the size of the spot at the plate surface 15, there is considerable latitude. The method described has been realized with spots varying from hundreds of microns to several mm in diameter. In all cases the reflected signal was quite adequate.

The radiation detector 23 is positioned such as to sense the intensity of the reflected beam 22 which is conditioned and amplified by amplifier 26 and passed to a controller 28. The selected detector 23 should have a large enough sensitive area so that if the reflected beam 22 moves around due to irregularities in the drum and/or plate surface, the reflected beam 22 is not spatially modulated as it impinges near the edge of the radiation detector. Additionally the detector 23 needs to have substantially uniform radiation responsivity over its full area so that, as the reflected beam 22 moves around over it's surface it is not modulated. The radiation detector could be a photo-detector, a CCD detector, or any other detector that is capable of sensing the radiation wavelength.

Optionally it is possible make use of a synchronous detection scheme, wherein the auxiliary radiation source is modulated using a modulation source 27 and detection is performed in synchronism with same modulation source 27. Synchronous detection would be advantageous for a plate that has a poor reflectivity or poor discrimination between imaged and non-imaged areas by reducing the noise from extraneous sources. The controller 28, which receives and converts the reflected radiation signal into a digital form, is then operative to perform the required analysis thereon.

Referring again FIG. 4, the plate 11, having been imaged, processed, and replaced on the platesetter, is now ready to be read-back. The pattern shown for illustrative purposes is a series of strips 30 of a pre-determined pattern imaged on the plate. Since the plate at this stage has been processed, the strips 30 are clearly visible. Typically, the plate will be rotated by the drum (not shown) to a position that places the strips 30 in the same plane as the beam 21. Alternatively, the scanning can be done around the drum in the same manner in which it was imaged allowing collection of a great number of data samples. These can be averaged to remove noise and variation across the test pattern strips. The exposure head (not shown) that carries the auxiliary radiation source 20 can be translated by the transport mechanism (also not shown) in the x-axis direction such as to scan the radiation beam 21 along the imaged strips. The controller is operative to distinguish between the reflectivity of strips 30 and to calculate the best set point for the particular parameter.

FIG. 5-A shows a series of strips 30 which could be used to determine any one of a number of parameters. The strips vary in density or "darkness" in response to a selected parameter change in the imaging process, all other parameters being kept constant. Typically, the parameter that is varied could be selected to be any one of the power of the write radiation source, the speed of the drum rotation, a parameter related to the focusing of the write radiation source or any one of a number of other parameters which have an effect on the image.

A representative cycle for setting up a platesetter comprises the following steps:

1. The processing line is first set up according to a pre-determined set of operating conditions. This comprises filling the processor with new or fresh chemical solutions and setting speed and temperatures correctly. While in theory it is possible to interactively adjust every parameter of the platemaking process, in practice it becomes very difficult to separate imaging and processing effects and it is usually prudent to choose a set-up strategy in which some parameters are set to standard conditions and other parameters varied in accordance with the test methods described here.

2. The exposure head write source is first set to a radiation level in the range known to be suitable for the plate being imaged. A parameter that changes the focus point of the write beam is varied through some range. At each adjustment point, a strip is imaged corresponding to that particular focus point. The plate is then processed, reloaded and scanned, and the reflected light measured according to the method described above.

FIG. 5-B shows a typical result of the scanned reflectivity of the strips. The measurement units are not of significance since the process is peculiar to a particular exposure head and platesetter configuration. The graph shows the individual measurements of reflectivity as "Data" and a line "Fit" which is a mathematical curve fit to the measured data points. For this particular plate, where the write beam is not in good focus, the processing step removes some or all of the coating exposing the substrate below. The substrate is typically more reflective than the plate coating. The strip exposed closest to optimal focus will not be removed by processing but rather be hardened. It will remain absorptive of the auxiliary radiation source. This is clearly shown in the graph of FIG. 5-B which shows the reflectivity dropping as the write radiation source approaches focus, reaching a minimum at focus and increasing thereafter.

The curve fitting is effective to reduce the measurement noise by including several data points in the determination of the optimal focus point. Additionally the discrete nature of the measurements means that there could easily be an ambiguity if two strips were equally reflective close to the minimum. This ambiguity is eliminated by fitting a curve over a number of data points. The inflection point shown by the arrow can be taken as the optimal focus setting for the write radiation source.

3. Having set the focus to the optimal point the exposure level is then set for optimal printing and imaging performance. In a system where the imaging performance is a strong function of focus, it is best to first ensure that the system is optimally focussed as detailed in step 2 above. A similar test pattern, this time with varying exposure level, is plotted, processed, replaced on the platesetter and read-back. The graphed results are shown in FIG. 5-C.

In this case, for a particular plate at very low exposure, the coating is not sufficiently exposed and it is washed off in the processing step. As exposure is increased, a point is reached where some coating remains after processing and some is washed off. This will be termed the transition point and is marked as 40 in FIG. 5-C. For this particular plate there is a sharp transition region around transition point 40 whereafter the coating no longer washes off, as evidenced by low reflectivity levels. Many plate types follow a similar pattern and the optimal exposure point is often chosen with reference to a transition point 40 that is roughly half way between the highest and lowest reflectivity. Best exposure is calculated using some exposure factor 41 relative to the transition point 40, which has previously been determined by the manufacturer of this plate for optimal press operation.

4. In a third step, for a multi-beam platesetter, it may be necessary to balance the exposure of the individual beams. It is common in multi-beam imaging systems for a radiation detector to be made available that is used to calibrate and balance the power of each beam. However, since there is a spatial as well as power component to what is actually imaged on the plate, it is not sufficient to simply balance power. Each beam needs to impart a substantially uniform exposure level to the plate.

In a multi-beam platesetter, a number of beams are imaged simultaneously in what is termed a swath. FIG. 5-D shows a series of four adjacent swaths 42 imaged in a helix around the drum. For each rotation of the drum 10, the exposure head will be translated by exactly one swath width so that the next swath lines up perfectly with the previous one. Any in-homogeneity between beams can show up as an imaging artefact making adjacent swaths clearly visible to the human eye, which is un-desirable in the platemaking process. An effective method of balancing the exposure of the beams in such a system involves writing multiple swaths of a test pattern and then reading back the reflectivity of the test pattern at multiple points in each swath. FIG. 5-E shows a graph of the reflected intensity of three adjacent swaths 42 for a particular situation. It can be seen that in this situation, the intensity of the swath varies due to beams on one side imparting a different exposure to the plate than those on the other side. In this simplified case, the variation is almost linear across the swath.

In order to make any meaningful correction to the beam power, it is first necessary to determine the swath boundaries so that a correction is correctly applied to the corresponding beam. In a situation where the beams are already closely balanced, it may be difficult to determine the swath boundaries. A technique that has been successfully applied is to increase or decrease power to one or more beams in some predetermined manner such that these beams can easily be identified in the read-back reflectivity. This aids in finding the swath boundaries. FIG. 5-E shows a case where the first beam 43 is intentionally increased by approximately 5% to demarcate the swath boundary.

Once the swath boundaries have been demarcated, a correction can be determined for each beam. FIG. 5-F shows a graph after such a correction has been applied. Finally, the swath boundary markers are removed as shown in FIG. 5-G. At this stage, the image should be substantially free of any boundary effects that render the swaths visible to the human eye.

In an alternative embodiment of the present invention, a series of test patterns are plotted with different correction functions applied. The most common problems are corrected by application of linear and a quadratic correction. The read back is used to determine which of these corrections gives the most uniform result. This technique is used to avoid having to do multiple iterations of the image and read-back cycle, since imaging systems are seldom linear in their response and calculating the exact correction is not always possible.

The above process typifies some of the settings that lend themselves to automation by the method described in this application. However, it should be clear that there are any number of tests that can be performed in this manner which are considered to be part of this invention.

In an alternative embodiment the auxiliary laser is not required. Referring to U.S. Pat. No. 6,37,580, an autofocus system is disclosed which has an auxiliary laser source and a sensor normally operative as a position-sensitive detector for performing focusing operations. Since it would not normally be necessary to have the autofocus system operative during the read-back of the imaged test strips, it is possible to use this system to sense reflectivity with little or no modification. Since the focus laser is normally selected to give a reasonable reflected light level from commonly used plate types, its wavelength should also be suitable for measuring reflectivity. In such a case, the read-back system disclosed above can be implemented with little or no added hardware.

In another alternative embodiment of the present invention, it is not essential to have a separate radiation source for the read-back function. It is possible to use the write radiation source for the read-back with the addition of a radiation detector, arranged to detect the back-reflected component of the write radiation source. Again, since the write beam is not operative during the read-back it can be switched on at a suitable power level and used as the radiation source. Furthermore, since the operation of most plates depends on the coating being absorptive at the write wavelength there should be good reflectivity discrimination between imaged and non-imaged areas at this wavelength.

Furthermore, it can readily be appreciated that the methods and apparatus described in the present application can equally well be applied to a system where the imaging is done directly on the press. Several systems are available which dispense with the separate platesetter and combine the imaging and printing function on the press itself. The exposure head 12 will be mounted on a translation mechanism on the press, positioned to be able to write the plate directly on the press cylinder. The same methods of reading back a test image using a laser and radiation detector set up to measure reflectivity can be applied in this case.

In another alternative embodiment of the present invention, the methods and apparatus described in this application can also be applied to a system where the lithographic printing precursor is formed by rolling, spraying, or otherwise coating the radiation sensitive material directly onto the press cylinder.

While the preferred embodiment has been described with reference to a particular architecture for a platesetter known as an "external drum" device, depicted in FIG. 2, alternative architectures such as "internal drum" or flatbed CTP systems could equally well be adapted to incorporate the methods described in this application. While there may be some differences in the details of the actual implementation, the principles remain the same.

It should be understood that the above descriptions of the simple and preferred embodiments are intended for illustrative purposes only, and are not intended to limit the scope of the present invention in any way. Those skilled in the art will appreciate that various modifications can be made to the embodiments discussed above without departing from the spirit of the present invention.

What is claimed is:

1. A method of optimally adjusting an imaging process parameter in the preparation of a lithographic printing surface, said method comprising the steps of:
   a) imaging a test pattern on a lithographic printing precursor to create by means of said imaging an imaged lithographic printing precursor using at least one write radiation beam;
   b) converting said imaged lithographic printing precursor into said lithographic printing surface;
   c) reading back said test pattern from said lithographic printing surface using a radiation source impinging on said test pattern and a radiation detector disposed to measure the reflected radiation from said test pattern; and
   d) analysing said reflected radiation to determine optimal adjustment for said imaging process parameter.

2. The method of claim 1 wherein said imaging process parameter is exposure level.

3. The method of claim 1 wherein said imaging process parameter is used in determining the focusing of the write radiation beam onto the surface of said lithographic printing precursor.

4. The method of claim 1 wherein:
   a) said imaging is done using a plurality of write radiation beams;
   b) said imaging process parameter is the relative exposure of said plurality of write radiation beams; and
   c) each individual beam of said plurality of write radiation beams is adjusted to impart a substantially equal exposure to said lithographic printing precursor.

5. The method of claim 1 wherein said test pattern is a solid pattern imaged with all of said at least one write radiation beams switched on.

6. The method of claim 1 wherein said test pattern is a pattern of imaged and non-imaged areas varying in a known manner.

7. The method of claim 1 wherein said radiation source is a laser source.

8. The method of claim 7 wherein said laser source is an auxiliary laser source.

9. The method of claim 7 wherein said laser source is an infrared laser.

10. The method of claim 7 wherein said laser source is an auxiliary laser source also operative in a system for controlling the focus of said at least one write radiation beam.

11. The method of claim 1 wherein said radiation source is also used to perform said imaging.

12. The method of claim 1 wherein said radiation detector is a photosensitive detector.

13. The method of claim 1 wherein said radiation detector is an infrared detector.

14. The method of claim 1 wherein said radiation detector is also operative in a system for controlling the focus of said at least one write radiation beam.

15. The method of claim 1 wherein said analysing step comprises performing a mathematical curve fit to the measurements of said reflected radiation.

16. The method of claim 1 wherein said converting comprises passing said lithographic printing precursor through a processing line.

17. The method of claim 1 wherein said converting is done simultaneously with said imaging step.

18. The method of claim 1 wherein said converting comprises removing debris generated by said imaging while said imaging of said lithographic printing precursor is in progress.

19. The method of claim 1 comprising varying said imaging process parameter with position in said test pattern.

20. The method of claim 19 wherein said analysing step comprises performing a mathematical curve fit to the measurements of said reflected radiation.

21. A method of calibrating a system for imaging a lithographic printing precursor comprising the steps of:
   a) forming a test pattern on said lithographic printing precursor;
   b) converting said lithographic printing precursor into a lithographic printing surface;
   c) measuring the reflectivity of said test pattern on said lithographic printing surface; and
   d) adjusting the calibration of said system based on the measured reflectivity;
   wherein the formation of said test pattern and the measurement of said reflectivity is performed using the same imaging system.

22. A method of calibrating imaging process parameters in a direct on-press imaging system comprising the steps of:
   a) forming a test pattern on a lithographic printing precursor;

b) converting said lithographic printing precursor into a lithographic printing surface;

c) measuring the reflectivity of said test pattern on said lithographic printing surface; and d) adjusting the calibration of said imaging system based on the measured reflectivity.

23. The method of claim 22 wherein said converting step is accomplished by running the press for sufficient printing cycles after said imaging step to perform the conversion of said lithographic printing precursor into said lithographic printing surface.

24. The method of claim 22 wherein said lithographic printing precursor is prepared by applying the imageable coating directly to the press cylinder.

25. The method of claim 24 wherein said applying comprises spraying a substantially liquid coating directly onto the press cylinder.

26. An apparatus for generating an optimally imaged lithographic printing surface comprising:

a) means for imaging a test pattern on a lithographic printing precursor and converting said lithographic printing precursor into a lithographic printing surface;

b) a radiation source disposed so as to direct its radiation onto the imaged test pattern;

c) a radiation detector disposed so as to receive reflected radiation from said imaged test pattern; and d) means of processing the signals corresponding to said reflected radiation to determine optimal adjustment of the imaging parameters of said apparatus.

27. A method for controlling a machine for making lithographic printing plates, the machine having one or more controllable parameters, the method comprising:

imaging a test pattern onto a lithographic printing precursor and adjusting the one or more controllable parameters so that a plurality of different areas within the test pattern correspond to different values of the one or more controllable parameters;

converting the lithographic printing precursor into a lithographic printing surface;

measuring reflectivity of the test pattern at least within the plurality of different areas; and, based upon the measured reflectivities automatically determining an optimized value for at least one of the one or more controllable parameters.

28. A method according to claim 27 comprising automatically setting the value of the at least one of the controllable parameters to have the optimized value.

29. A method according to claim 27 wherein the at least one of the controllable parameters comprises a relative power of a plurality of radiation beams used to create the test pattern.

30. A method according to claim 27 wherein the at least one of the controllable parameters comprises a parameter related to the focusing of at least one radiation beam used to create the test pattern.

31. A method according to claim 30 wherein determining the optimized value comprises identifying a value for the focus parameter corresponding to a minimum in the reflectivity.

32. A method according to claim 31 comprising fitting a curve to the measurements of reflectivity and determining a location on the fitted curve corresponding to minimum reflectivity.

33. A method according to claim 27 wherein the at least one of the controllable parameters comprises a power of at least one radiation beam used to create the test pattern.

34. A method according to claim 33 wherein determining the optimized value comprises identifying a transition point in the reflectivity.

35. A method according to claim 34 wherein determining the optimized value comprises computing the optimized value by applying an exposure factor to the transition point.

36. A method according to claim 34 wherein identifying the transition point comprises fitting a curve to the measured reflectivity and locating an inflection point in the fitted curve.

37. A method according to claim 27 wherein imaging the test pattern is performed with multiple radiation beams;

the at least one of the controllable parameters comprises a power balance between the multiple radiation beams;

the method comprises modulating a power of at least one of the multiple radiation beams in a recognizable pattern and identifying a swath corresponding to the at least one of the multiple radiation beams by detecting the recognizable pattern in the measured reflectivity.

* * * * *